United States Patent
Mohwinkel et al.

[11] Patent Number: 5,983,089
[45] Date of Patent: *Nov. 9, 1999

[54] SLOTLINE-MOUNTED FLIP CHIP

[75] Inventors: Clifford A. Mohwinkel, San Jose; Edward B. Stoneham, Los Altos; Edwin F. Johnson, Sunnyvale, all of Calif.

[73] Assignee: Endgate Corporation, Sunnyvale, Calif.

[*] Notice: This patent is subject to a terminal disclaimer.

[21] Appl. No.: 08/725,972

[22] Filed: Oct. 4, 1996

Related U.S. Application Data

[63] Continuation-in-part of application No. 08/400,025, Mar. 6, 1995, Pat. No. 5,698,469, which is a continuation-in-part of application No. 08/313,927, Sep. 26, 1994, abandoned.

[51] Int. Cl.$^6$ ..................................................... H04B 1/26
[52] U.S. Cl. ............................ 455/323; 455/327; 333/128
[58] Field of Search .................................. 455/318, 319, 455/320, 323, 325, 326, 327, 328, 330, 333; 333/26, 128, 238, 246, 247

[56] References Cited

U.S. PATENT DOCUMENTS 3,939,430  2/1976  Dickens et al. .
4,032,849  6/1977  Gysel et al. .

(List continued on next page.)

FOREIGN PATENT DOCUMENTS

| 0 627 765 A1 | 12/1994 | European Pat. Off. . | |
|---|---|---|---|
| 41 28334 A1 | 3/1993 | Germany . | |
| 106027 | 6/1985 | Japan | 455/326 |
| 60-153602 | 8/1985 | Japan . | |
| 187710 | 8/1988 | Japan | 455/327 |
| 63-240102 | 10/1988 | Japan . | |
| 1-005102 | 1/1989 | Japan . | |
| 0 358 497 A2 | 3/1990 | Japan . | |
| 0 358 497 A3 | 3/1990 | Japan . | |

OTHER PUBLICATIONS

Ulrich L. Rohde, "Performance Capability of Active Mixers", Professional Program Session Record 24, Wescon/81, pp. 1–17, Electronic Show & Convention, Sep. 15–17, 1981—Brooks Hall & Civic Audirotium, Program—Hilton Hotel, San Francisco, California.

S. Weiner, D. Neuf, S. Spohrer, "2 to 8 GHZ Double Balanced Mesfet Mixer with +30 DBM Input 3rd Order Intercept:", 1988 IEEE MTT–S Digest, pp. 1097–1100.

M. Goetz et al., "Measurement of a 24–GHz Broad–Band Multilayer Ceramic Feedthru for Micro– wave Packaging", *IEEE Microwave and Guided Wave Letters,* May 1992, NO. 5, pp. 171–173.

(List continued on next page.)

*Primary Examiner*—Thanh Cong Le
*Attorney, Agent, or Firm*—Anderson & Adamson

[57] ABSTRACT

First and second slotlines are mounted on an electrically insulating substrate having a planar face with a connection region. Each slotline has first and second, spaced-apart coplanar conductors that extend into the connection region. A fifth, ground conductor, also mounted on the substrate face, is spaced from and coplanar with the first and second slotlines and has a proximal portion in the connection region. A chip circuit includes first and second field-effect transistors (FETs) flip mounted in the connection region to all five conductors. The gates of the FETs are connected to the first slotline for receiving an input signal. The drains are connected to the second slotline for outputting the signal amplified by the transistors. The sources of the FETs are connected to the fifth conductor. This general configuration can be modified for use as an amplifier, oscillator, frequency multiplier or mixer. The slotline may divide into parallel slotline portions for providing plural circuits in parallel with distributed impedance matching. A slotline may loop back from the connection region to provide a choice for impedance matching, and a portion of the fifth conductor may extend between slotline conductors to provide capacitive coupling.

31 Claims, 7 Drawing Sheets

U.S. PATENT DOCUMENTS

| | | |
|---|---|---|
| 4,097,814 | 6/1978 | Cohn . |
| 4,135,168 | 1/1979 | Wade . |
| 4,193,048 | 3/1980 | Nyhus . |
| 4,249,263 | 2/1981 | Shinkawa et al. . |
| 4,320,536 | 3/1982 | Dietrich . |
| 4,376,287 | 3/1983 | Sechi . |
| 4,377,005 | 3/1983 | Marchand et al. . |
| 4,411,022 | 10/1983 | Clifton et al. . |
| 4,485,488 | 11/1984 | Houdart . |
| 4,523,163 | 6/1985 | Houdart et al. . |
| 4,542,535 | 9/1985 | Bartes et al. . |
| 4,553,226 | 11/1985 | Bates et al. . |
| 4,553,265 | 11/1985 | Clifton et al. . |
| 4,603,436 | 7/1986 | Butler . |
| 4,607,394 | 8/1986 | Nightingale . |
| 4,658,440 | 4/1987 | Pavio et al. . |
| 4,739,519 | 4/1988 | Findley . |
| 4,751,744 | 6/1988 | Pavio, Jr. . |
| 4,949,398 | 8/1990 | Maas . |
| 4,955,079 | 9/1990 | Connerney et al. . |
| 5,066,926 | 11/1991 | Ramachandran et al. . |
| 5,087,896 | 2/1992 | Wen et al. . |
| 5,115,245 | 5/1992 | Wen et al. . |
| 5,127,102 | 6/1992 | Russell ................................. 455/327 |
| 5,142,239 | 8/1992 | Brayton et al. . |
| 5,149,671 | 9/1992 | Koh et al. . |
| 5,194,833 | 3/1993 | Dougherty et al. . |
| 5,265,266 | 11/1993 | Trinh . |
| 5,266,963 | 11/1993 | Carter . |
| 5,303,419 | 4/1994 | Ittipiboon et al. ...................... 455/327 |
| 5,345,194 | 9/1994 | Nagasako . |
| 5,355,095 | 10/1994 | Nathanson et al. . |
| 5,528,203 | 6/1996 | Mohwinkel ............................. 333/128 |
| 5,535,445 | 7/1996 | Gunton . |
| 5,610,563 | 3/1997 | Mohwinkel ............................. 333/128 |

OTHER PUBLICATIONS

H.B. Sequeira et al., "Monolithic GaAs W–Band Pseudomorphic Modfet Amplifiers", 12th Annual GaAs Symposium Technical Digest 1990, Oct. 7–10, 1990, pp. 161–164.

John J. Burke et al., "Surface–to–Surface Transition via Electromagnetic Coupling of Microstrip and Coplanar Waveguide", *IEEE Transactions on Microwave Theory and Techniques,* vol. 37, NO. 3, Mar. 1989, pp. 519–525.

Masayoshi Aikawa et al., "MMIC Progress in Japan", IEEE 1989 Microwave and Millimeter–Wave Monolithic Circuits Symposium Digest of Papers, Jun. 12–13, 1989, pp. 1–6, IEEE, U.S.A.

M. Aikawa et al., "MMIC Progress in Japan", Monolithic Circuits Symposium Digest of Papers, Jun. 12–13, 1989, pp. 1–6, IEEE 1989 Microwave and Millimeter–Wave, California, U.S.A.

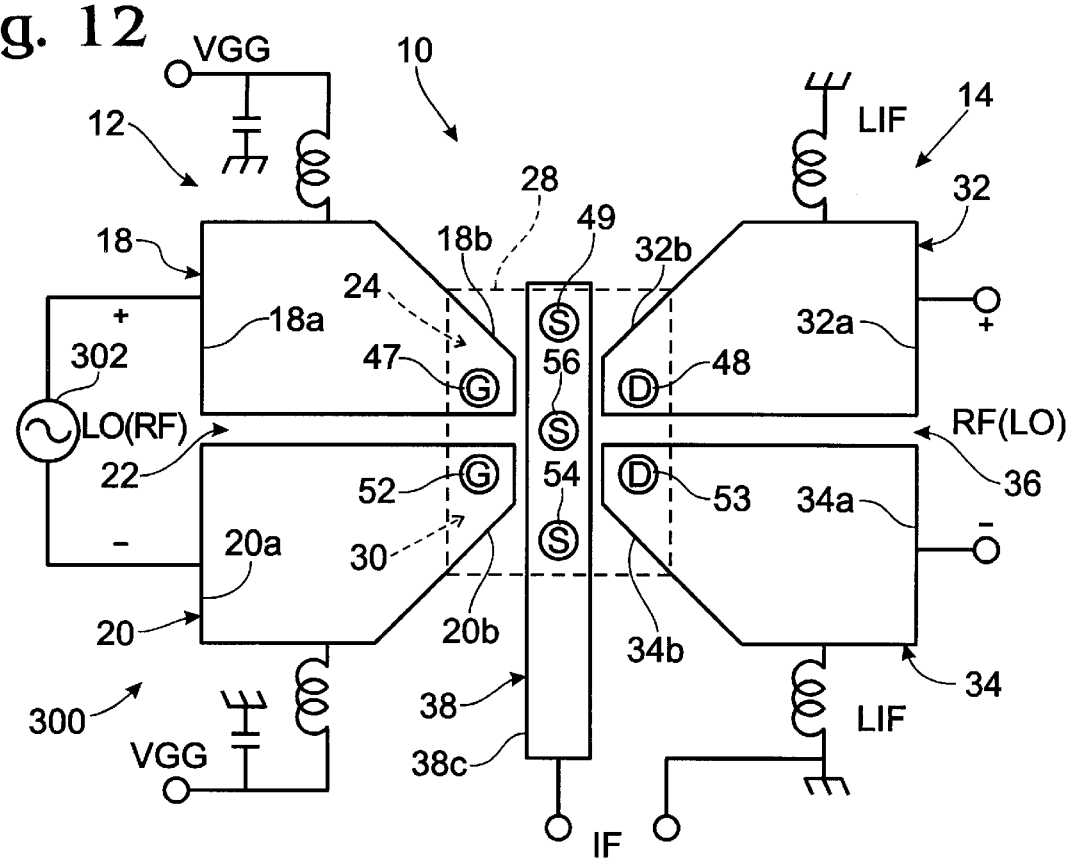
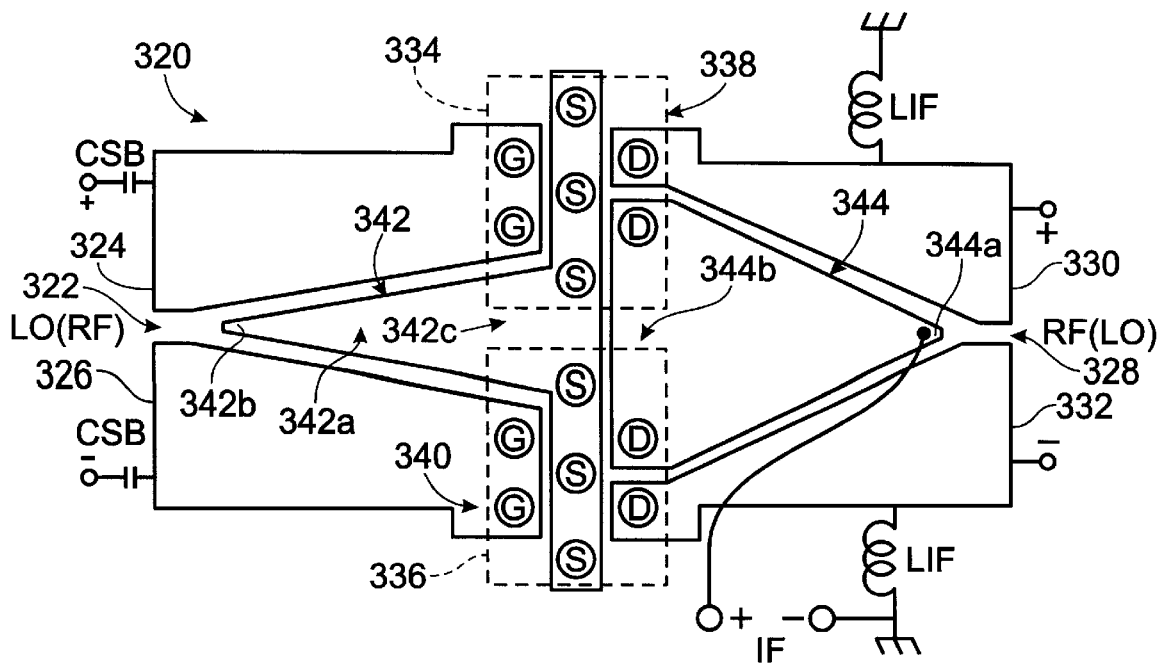

SLOTLINE-MOUNTED FLIP CHIP

This is a continuation-in-part of application Ser. No. 08/400,025, filed on Mar. 6, 1995, U.S. Pat. No. 5,698,469, which is a continuation-in-part of application Ser. No. 08/313,927, filed on Aug. 26, 1994, now abandoned.

BACKGROUND OF THE INVENTION

1. Field of the Invention

This invention relates to high frequency transmission line circuit structures, and in particular to such circuit structures having a chip circuit flip-mounted onto a slotline.

2. Related Art

Mounting flip-chips on a motherboard has been found to be an effective way to connect radio frequency circuit components together. The use of flip mounting provides an alternate attachment method that replaces the use of bond wires, backside metalization and vias, air bridges, and dielectric crossovers on the mother substrate. The conducting columns or bumps that connect the chip to the mother board can be formed using thermocompression bonding, solder, brazing material or adhesives.

Also, in such high frequency applications, the use of coplanar transmission lines is well established. Typical examples include conventional coplanar waveguides (ground-signal-ground lines), and slotlines. Slotlines may be formed by spaced opposite-polarity conductors, balanced ground-signal-signal-ground lines, and parallel-strip balanced lines. These coplanar transmission lines are particularly useful because of the simplified structure provided by having the signal-forming conductors on a single plane.

A slotline consists of two conductors mounted on one or both faces of a substrate. The conductors are spaced apart to form a slot. The slot is narrow enough for the conductors to be closely coupled, thereby making the conductor edges extending along the slot function as the primary transmission line. Slotlines are typically used to conduct balanced signals, such as are used in push-pull circuits. These circuits may or may not have a corresponding ground plane on the opposite or back side of the substrate. They may also be used for unbalanced signals, with one of the two conductors being at ground or other fixed common reference potential. Coplanar slotlines also have the advantages of not needing crossover conductors and having fewer conductors compared to coplanar waveguides.

Slotlines are historically made as semi-infinite conductors, with each conductor covering all of the portion of the face of the substrate to the side of the slot. A slotline may also be formed by conductor strips having limited widths. Conventionally, a coplanar waveguide consists of two coupled slotlines having the same signal and opposite polarity.

As used herein, a slotline is distinguished from a coplanar waveguide primarily in that the transmission line formed by a slotline for a given signal consists of only two conductors. This is to say, each conductor is only associated with one other conductor to form the transmission line. On the other hand, a coplanar waveguide has three conductors, an inner signal conductor bounded by spaced outer conductors with the outer conductors having the same polarity and sharing in the conduction of current relative to the middle conductor. In a coplanar waveguide, the center conductor has a polarity opposite from the polarity of the two outer conductors and is associated with both outer conductors to form the transmission line.

This definition does not preclude the use of other conductors in association with one or both of two slotline conductors for transmitting other signals, for impedance matching or for other functions, so long as the other conductors have arbitrary signal polarities relative to those of the slotline conductors.

Also as used herein, a chip circuit is one or more electrical components formed in or on a chip substrate. Typically, integrated circuits are formed on a chip substrate to form a chip circuit. Other forms of circuit structure may also be formed on a chip. When the chip circuit is flip-mounted onto a base substrate with chip connection points adjacent to the substrate surface, the chip containing the chip circuit is referred to as a flip-chip. A flip-chip may contain one or more circuits, elements or devices, each of which may or may not be interconnected onto the chip.

In a common amplifier application, the chip circuit is an integrated circuit containing one or more transistors and other devices, such as resistors, capacitors and inductors. In a power chip having a plurality of transistors, the transistors may be individually or collectively connected to the motherboard. Impedance-matching for the composite power transistor is typically, although not always, accomplished on the mother board substrate in order to minimize the size of the chip substrate.

SUMMARY OF THE INVENTION

It is desirable to tale advantage of flip-chip technology in radio frequency circuits, and in particular to apply such technology in the use of slotlines. It is further desirable to apply such technology in the formation of amplifiers, oscillators, mixers and the like.

This is provided in the present invention by a circuit structure having an electrically insulating base substrate having a planar face with a first connection region, and a slotline mounted on the substrate face. The slotline consists of first and second, spaced-apart coplanar conductors that extend into the connection region. A chip circuit is flip mounted onto the connection region of the base substrate with a first chip-circuit terminal connected to the first conductor and a second chip-circuit terminal connected to the second conductor. The slotline conducts an electrical signal relative to the chip circuit. As mentioned, the chip circuit, in the general sense, can have any functional circuit on it, such as a single active or passive device, or a more complex circuit formed of various combinations of such devices.

Various preferred embodiments of the invention further include a second slotline mounted on the substrate face spaced from the first slotline and consisting of third and fourth spaced-apart coplanar conductors having proximal ends extending into the connection region, and defining therebetween a second slot, the proximal end of the first slotline is spaced from the proximal end of the second slotline. A fifth conductor, also mounted on the substrate face, is spaced from and is coplanar with the first and second slotlines and has a proximal portion in the connection region. The proximal portion of the fifth conductor is also spaced from the proximal ends of the first and second slotlines.

The chip circuit includes first and second transistors, such as field-effect transistors (FETs), flip mounted in the connection region to all five conductors. The gates of the FETs are connected to the first slotline for receiving an input signal. The drains are connected to the second slotline for outputting the signal amplified by the transistors. The sources of the FETs are connected to the fifth conductor, which conductor is connected to ground. This general configuration can be modified for use as an amplifier, oscillator, or mixer.

The slotline may divide into parallel slotline portions for providing plural circuits in parallel, with each circuit providing impedance matching. A slotline may loop back from the connection region to provide a choke for impedance matching, and a portion of the fifth conductor may extend between slotline conductors to provide capacitive coupling.

In one embodiment, a mixer made according to the invention includes first and second active devices with one control terminal of each active device coupled together. A first high frequency terminal is coupled to the control terminal of a first active device, and a second high frequency terminal is coupled to the control terminal of a second active device for conducting a high frequency signal. A link conductor couples the other of the current-carrying terminals of the first active device to the other of the current-carrying terminals of the second active device. A local oscillator is coupled to the other of the current-carrying terminals of each active device for applying a local oscillator signal to the active devices. A first intermediate frequency terminal is coupled to the one current-carrying terminal of both active devices, and a second intermediate frequency terminal is coupled to a point on the link conductor intermediate its ends. The link conductor is preferably one-half of the local oscillator frequency wavelength away from conductors connecting the local oscillator to the active devices. The intermediate frequency signal is thereby taken at a point in the circuit that is relatively isolated from the radio frequency and local oscillator signals.

The invention thus provides for the advantageous use of flip mounting radio frequency chips directly onto slotlines. Compact circuit structures for amplifiers, mixers, oscillators and the like are thereby realized. These and other features and advantages of the present invention will be apparent from the preferred embodiments described in the following detailed description and illustrated in the accompanying drawings.

BRIEF DESCRIPTION OF THE DRAWINGS

FIG. 12 is a plan view of yet another embodiment of the invention of FIG. 1 in the form of a mixer.

FIG. 15 is a plan view of a third embodiment of a mixer made according to the invention.

DETAILED DESCRIPTION OF THE PREFERRED EMBODIMENTS

Figure 1:
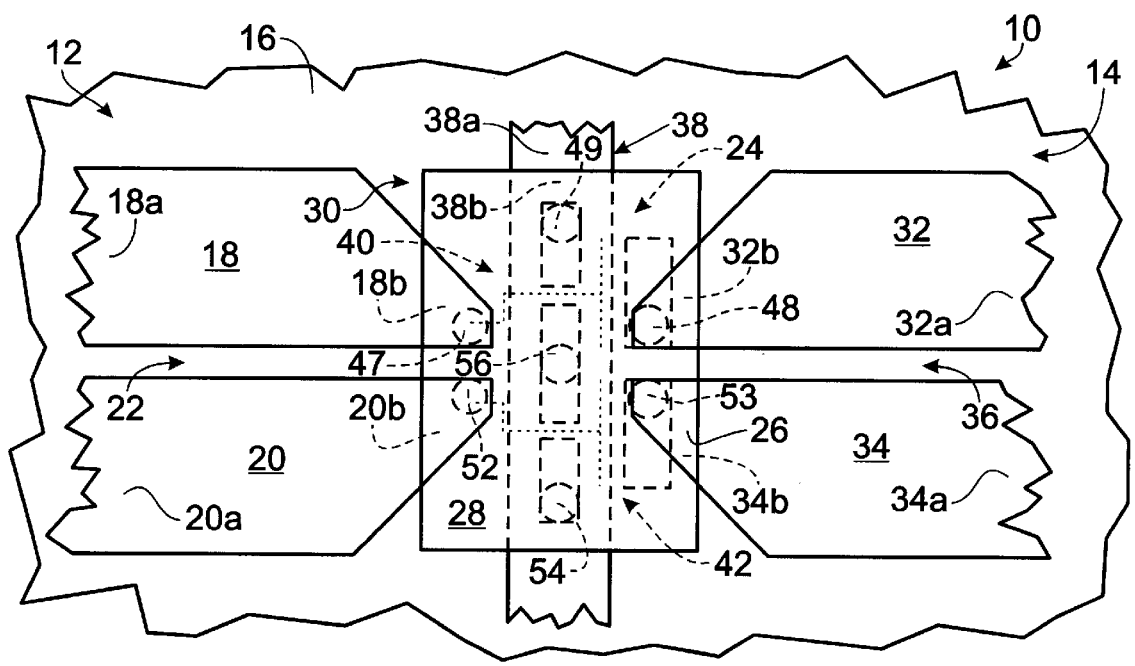
FIG. 1 is a plan view of a first preferred embodiment of an amplifier made according to the present invention.

Referring initially to FIG. 1, an exemplary amplifier 10 is shown that is made according to the invention. As has been mentioned, the present invention provides a circuit structure in which a chip circuit is flip-mounted onto a strip slotline. Depending upon the particular embodiment, the chip circuit, also referred to as chip circuit means, could be in the form of plural chips, where more than one device is contained in the chip circuit.

In FIG. 1, amplifier 10 includes an input strip slotline 12 and an output strip slotline 14 mounted on a planar insulating or semi-insulating base substrate 16. Slotline 12 includes conductors 18 and 20 formed in coplanar, spaced apart relationship to define an input slot 22. These conductors, shown as strip conductors, can have widths ranging from very narrow to semi-infinite. A chip circuit 24, as defined previously and shown in dashed lines, is formed on a chip substrate 26 of a flip chip 28. The chip outline defines the chip footprint or shadow over base substrate 16. This footprint is referred to as a connection region 30.

Output slotline 14 similarly includes conductors 32 and 34, shown as strip conductors, that are coplanar with conductors 18 and 20 and form output slot 36. Slots 22 and 36 generally have uniform widths, although they may be varied, such as for impedance matching. It is sufficient that the associated conductors be spaced near enough to be closely coupled.

Conductors 18 and 20 have distal ends 18a and 20a positioned away from connection region 30, and proximal ends 18b and 20b positioned in the connection region. Similarly, conductors 32 and 34 have distal ends 32a and 34a, and proximal ends 32b and 34b. The proximal ends of conductors 18 and 20 are spaced from the proximal ends of conductors 32 and 34. A fifth conductor 38, spaced from conductors 18, 20, 32 and 34, passes through connection region 30. Conductor 38 has a distal portion, such as portion 38a, spaced from the connection region, and a proximal portion 38b in the connection region.

In the embodiment shown in FIG. 1, circuit 24 on chip 28 is an integrated circuit composed of dual field-effect transistors (FETs) 40 and 42 illustrated in dashed lines. FETs 40 and 42 have respective gates, drains, and sources, such as gate 43, drain 44, and source 45 of transistor 40, shown in FIG. 2. Circuit 24 includes terminals 47, 48 and 49 (FIG. 1) associated with and connected to the gate, drain and source of FET 40, respectively. These terminals are flip mounted onto the proximal ends and proximal portion of conductors 18, 32 and 38, respectively. Correspondingly, respective gate, drain and source terminals 52, 53 and 54 of FET 42 are connected to the proximal ends and proximal portion of conductors 20, 34 and 38. Additionally, a terminal 56 is common to FETs 40 and 42 for connecting the respective sources to fifth conductor 38, as shown.

Figure 2:
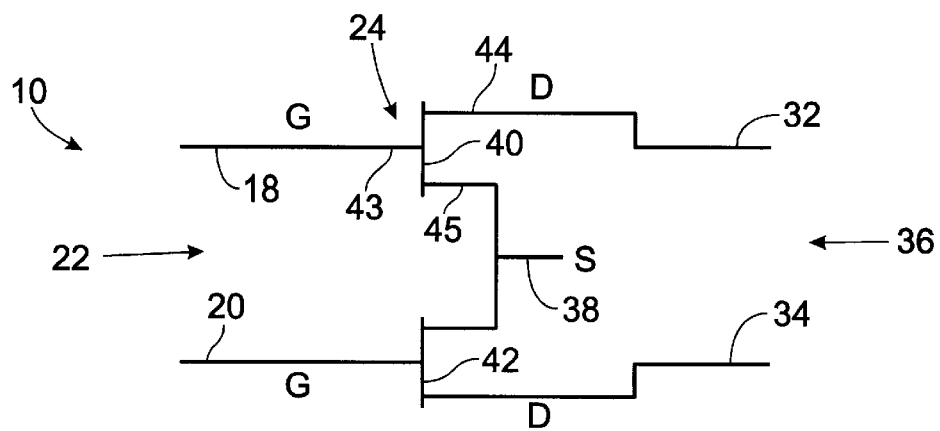
FIG. 2 is a schematic of the chip circuit included in the amplifier of FIG. 1.

FIG. 2 is a schematic illustrating generally the structure of chip circuit 24. The inputs to the gates, G, of FETs 40 and 42 are from conductors 18 and 20 of slotline 12. The sources, S, of the FETs are connected together by common connection to fifth conductor 38. The output signal is conducted from the drains, D, to conductors 32 and 34 of slotline 14. The FETs are thus seen to be connected in a series or push-pull configuration. When operated in a balanced-signal or push-pull mode, the source and fifth conductor are at virtual ground potential.

Figure 3:
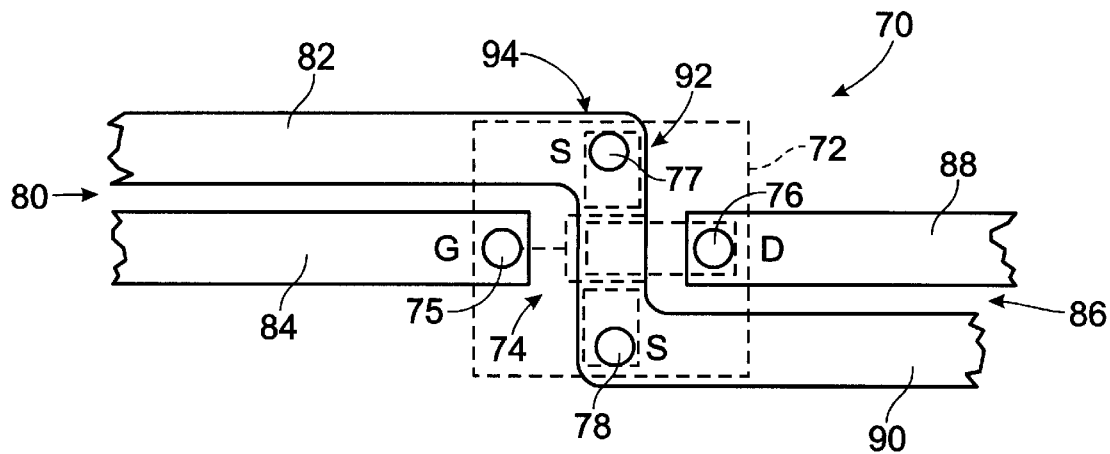
FIG. 3 is a plan view of a second embodiment of the invention of FIG. 1.

FIG. 3 illustrates a second amplifier embodiment according to the invention. An amplifier 70 includes a chip 72 having a FET 74 with a gate terminal 75, a drain terminal 76 and source terminals 77 and 78. An input slotline 80 consists of parallel strip conductors 82 and 84. An output slotline 86 consists of parallel strip conductors 88 and 90. Conductors 82 and 90 are integrally joined in a connection region 92 to form a single continuous conductor 94.

During operation, conductors 82, 84 and 88, 90 carry the input and output signals, respectively. A variation of this structure is to have conductors 84 and 88 on opposite sides of conductor 94, with conductors 82 and 90 aligned.

Figure 4:
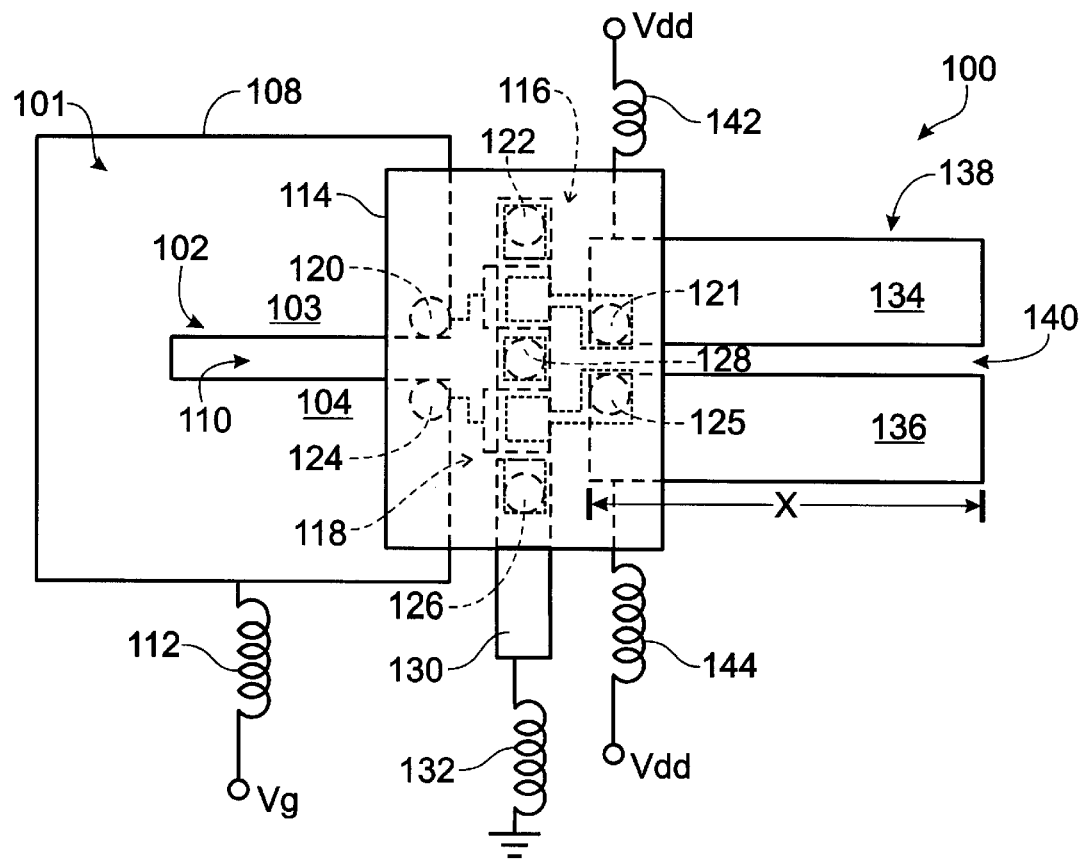
FIG. 4 is a plan view of a third embodiment of the invention in the form of an oscillator.

FIG. 4 shows a third embodiment of amplifier 10 of FIG. 1. This figure illustrates the general configuration for a push-pull oscillator 100 made according to the invention. A tank circuit 101 includes slotline 102 of limited length, formed by conductor portions 103 and 104. Tank circuit 101 is dimensioned to resonate with the active device impedances at a design frequency. Circuit 101 is formed as a single metalization 108 with a slot 110 extending into it, as shown. Metalization 108 is coupled to a gate bias voltage supply, $V_g$, by an inductor 112.

Resonator 110 could also be coupled to a resonant device, such as a cavity, not shown. A cavity could have relatively high Q and resonator 110 could couple into the cavity at whatever level of coupling is desired to give stable oscillation for all operating temperatures.

A flip chip 114 has dual-FETs 116 and 118. Dual-FETs 116 and 118 have respective gate, drain and source terminals 120, 121, 122 and 124, 125, 126. A common source terminal 128 is shared by the FETs. Gate terminals 120 and 124 are flip mounted onto the proximal ends of conductors 103 and 104. The source terminals are flip mounted onto the proximal portion of a central or source conductor 130. Source conductor 130 is coupled to ground or other reference voltage, $V_S$, through an inductor 132.

The output of oscillator 100 can be taken from the distal ends of conductors 134 and 136, which form a second slotline 138 having a slot 140. The width of slot 140 is set to provide a desired amount of capacitance to virtual ground. Since the source is at virtual ground, the capacitance of slot 140 provides capacity from one drain to the source and to the other drain. It is not necessary to capacitively couple the drains directly to the source. The length x of conductors 134, 136 is preferably less than one-quarter of a wavelength.

Drain terminals 121 and 125 are flip mounted onto the proximal ends of conductors 134 and 136. These proximal ends are also coupled to a drain bias voltage, $V_{dd}$, via respective inductors 142 and 144.

Figure 5:
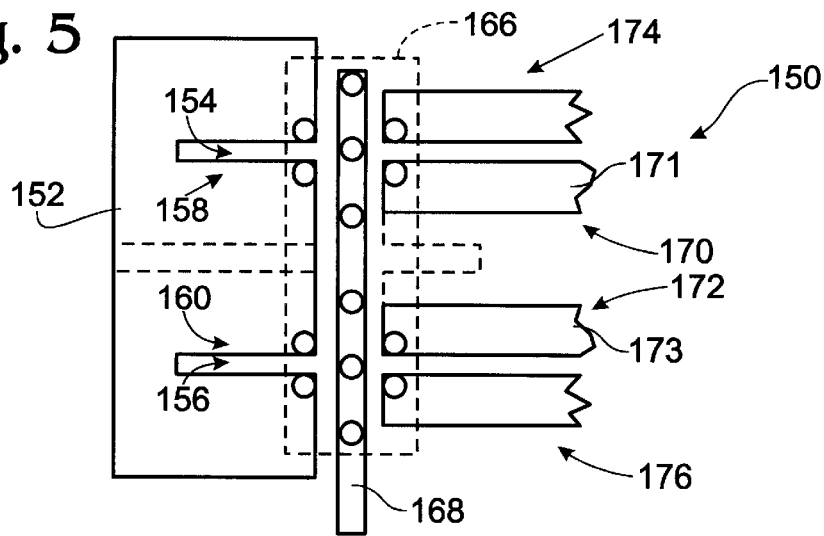
FIG. 5 is a simplified plan view of a dual oscillator made according to the invention and similar to the oscillator of FIG. 4.

FIG. 5 illustrates a dual oscillator circuit structure 150 patterned after oscillator 100. A single metalization layer 152 has slot resonators 154 and 156 which define slotlines 158 and 160. Alternatively, two sections of metalization could be used, as is suggested by the two horizontal dashed lines through layer 152. A single chip 166 provides associated sets of FETs, and a single source conductor 168 couples the sources of the respective FETs to a common ground potential. Separate, spaced apart output slotlines 170 and 172 are provided. The inner conductors 171, 173 of the two slotlines could be formed from a single metalization, as represented by the dashed lines. This configuration provides parallel oscillators 174 and 176, but may be extended to provide more than two oscillators.

Figure 6:
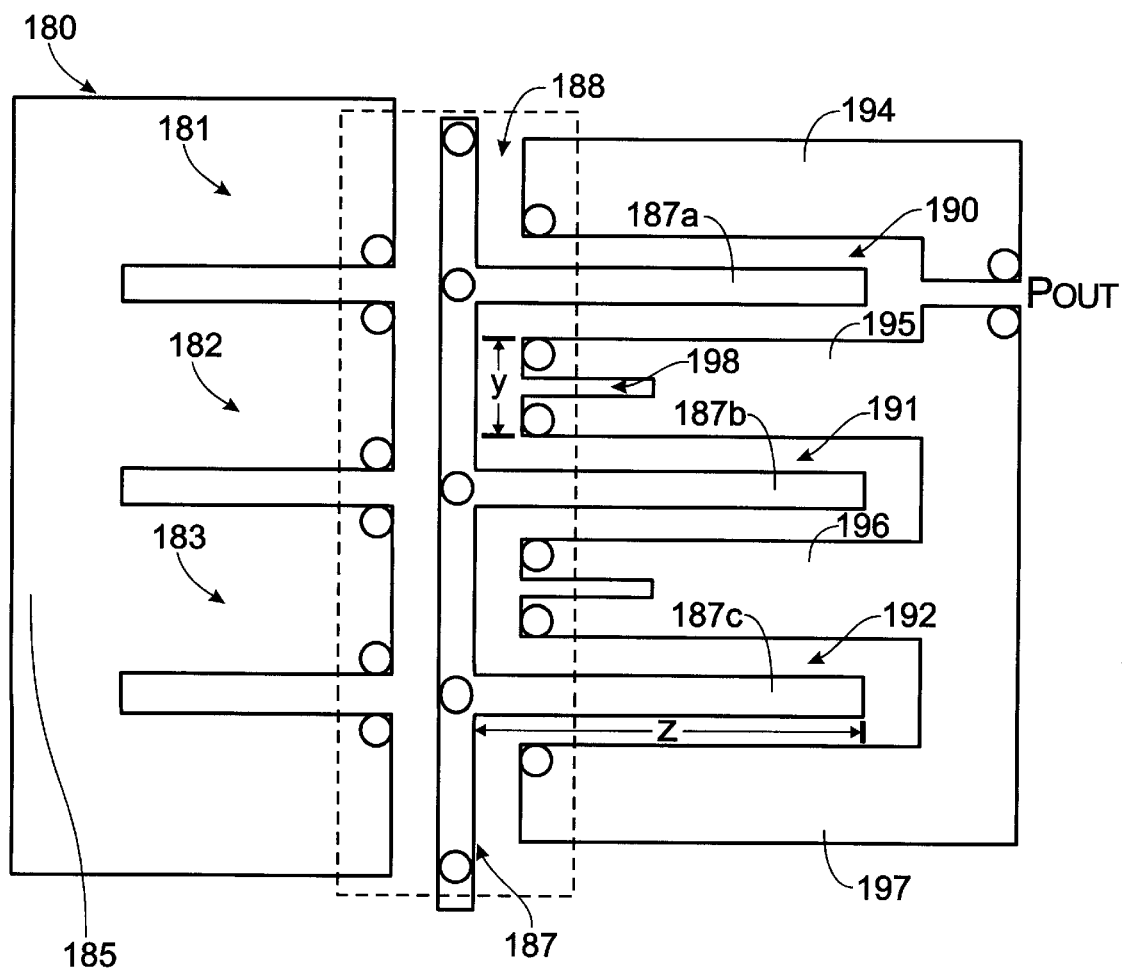
FIG. 6 is a multiple oscillator made according to the invention as a variation of the embodiment of FIG. 5.

FIG. 6 illustrates a circuit structure 180 providing multiple oscillators 181, 182, 183. The structure shown may be extended to provide the number of oscillators desired. A multiple-resonator metalization 185 provides the slot-line connected resonators for each oscillator, as described for circuit 150. In this embodiment, a portion of source conductor 187 distal from connection region 188 extends into each of output slots 190, 191, 192. These slots are formed by output drain conductors 194, 195, 196, 197. Intermediate drain conductors, such as drain conductor 195, function as a conductor of adjacent slots, such as adjacent slots 190 and 191. These intermediate drain conductors have a width y that is preferably about one-quarter wavelength, but may be less if a slot, such as slot 198 in conductor 195, is provided. The slot increases the effective width of the conductor, providing isolation between drains.

Source-conductor portions, 187a, 187b, 187c, which preferably have a length z that is less than one-quarter wavelength, provide capacitive coupling directly between each adjacent output drain conductor and the associated source conductor. The distal source-conductor portions also allow for external connection to the source conductor. Although this structure has the appearance of a coplanar waveguide, the drain conductors forming each of slots 190, 191, 192 have opposite signal polarities, both of which are different than the signal polarity on the source conductor portion. Each of the oscillators injection lock, thereby increasing the gate periphery that the oscillator can oscillate. This has the effect of reducing the phase noise.

Figure 7:
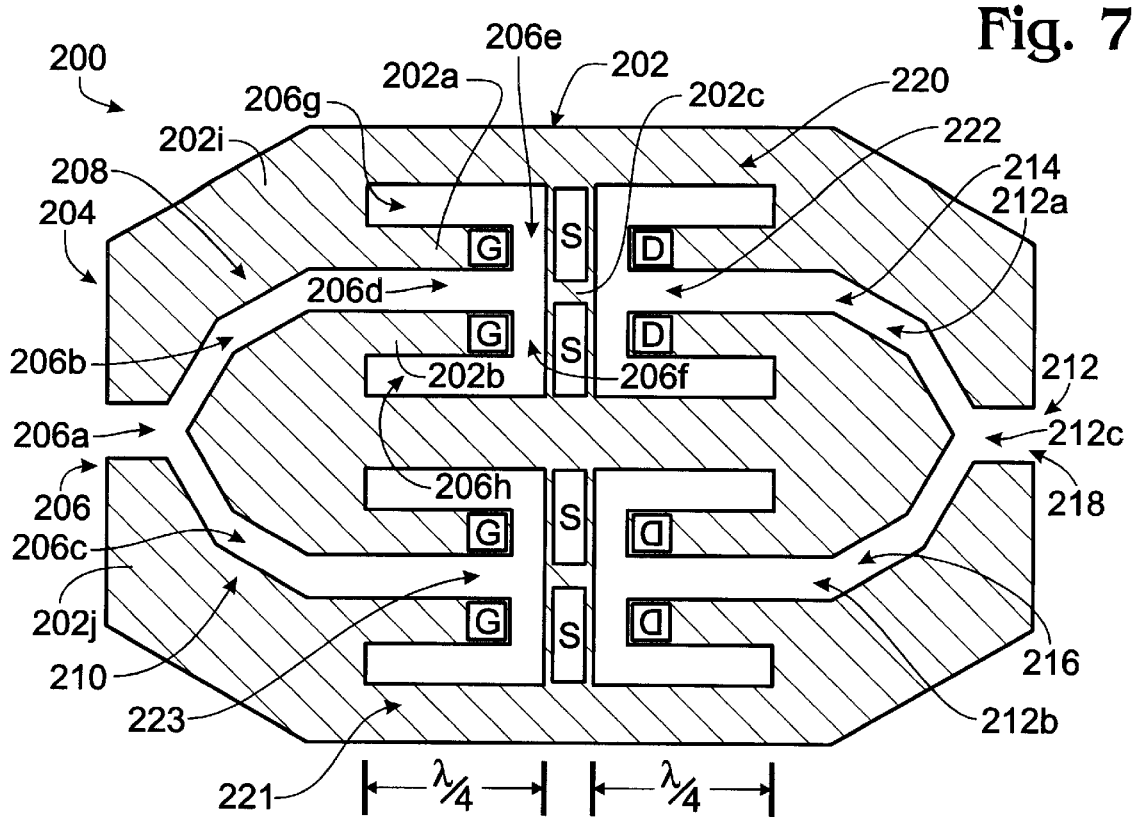
FIG. 7 illustrates a plan view of two series-connected push-pull amplifiers made according to the invention.

FIG. 7 illustrates yet another embodiment of the invention, a slotline amplifier 200. Amplifier 200 is constructed with a single metalization layer 202 which forms input slotlines, chip connection region, and output slotlines. More specifically, an input slotline 204, defined by an initial input slot portion 206a of an input slot 206, bifurcates into branch slotlines 208 and 210. The branch slotlines are formed, respectively, by slot branches 206b and 206c.

The upper and lower halves of amplifier 200 function the same, so the discussion is limited to the upper section with the understanding that comments directed to the upper section apply equally well to the lower section. The proximal end of input slot branch 206b is shaped like a reverse "E" with a long center leg portion 206d, oppositely extending transverse bends 206e and 206f, and closed-ended outer leg portions 206g and 206h that are parallel to center leg portion 206d. This shape produces respective open-ended conductor fingers 202a and 202b extending between the slotline leg portions. The outer leg portions function as RF chokes.

There also is an output slot 212 having branch portions 212a and 212b that join to form output portion 212c. Slot 212 thus forms branch slotlines 214 and 216, and output slotline 218. The output slotlines are shown as a mirror image of the input slotlines and function the same way, although the dimensions will be different due to impedance-matching differences of the input and output circuits.

Corresponding FET structure is not shown, but is similar to that described previously. The connection of the gate, drain, and source terminals are represented by the contact pads identified respectively by G, D, and S. The gate terminals are shown to be connected to the ends of the input fingers 202a and 202b. The source terminals are connected to conductor portion 202c which extends between the backs of the E-shaped slots. The section of conductor portion 202c between the two source pads is at virtual ground. The drain terminals are connected to the ends of the output fingers, as shown.

Figure 8:
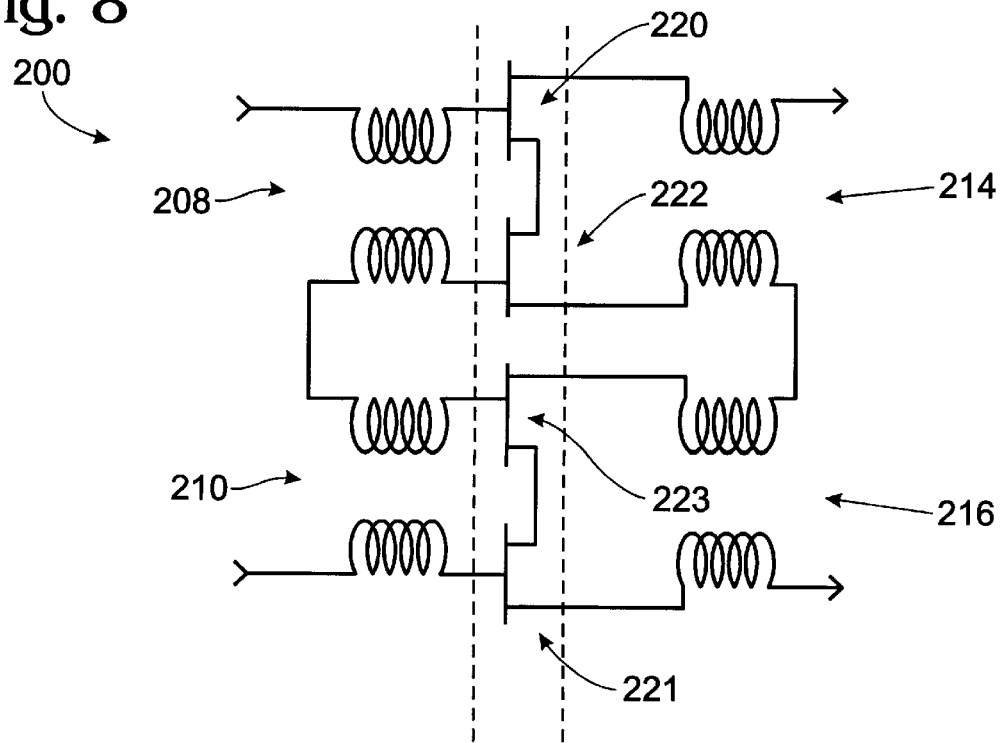
FIG. 8 is a schematic of the embodiment of FIG. 7.

FIG. 8 is a simplified schematic illustrating the circuit of amplifier 200. As shown in FIG. 7, the input signal is applied effectively to input conductor portions 202i and 202j at input slot portion 206a. The signals are input to the gates of FETs 220 and 221. The input signals are coupled to the input conductors on the gates of FETs 222 and 223 via electromagnetic coupling across branch slot portions 206b and 206c. The gates and drains of FETs 222 and 223, respectively, share the same coupling method. The output signal is taken from the drains of FETs 220 and 221 with similar electromagnetic coupling between the drains of FETs 220 and 222, and, between the drains of FETs 221 and 223.

Through electromagnetic coupling on the input and output of each branch slotline, each branch signal is divided for amplification by two FETs. The series/series push-pull configuration shown in FIGS. 7 and 8, with the split slotline, divides the signal for amplification by four FETs and provides impedance transformation. By dividing an input signal into a signal for each circuit section and recombining the output signals, substantial power combination is achieved. Impedance matching can be provided at the individual FETs, and/or before or after signal division or recombination. The slotlines are designed to achieve whatever impedance matching is needed. The input or output impedances are connected in series until the impedance is high enough, and then they can be connected in a number of parallel sections appropriate for the desired power level.

Figure 9:
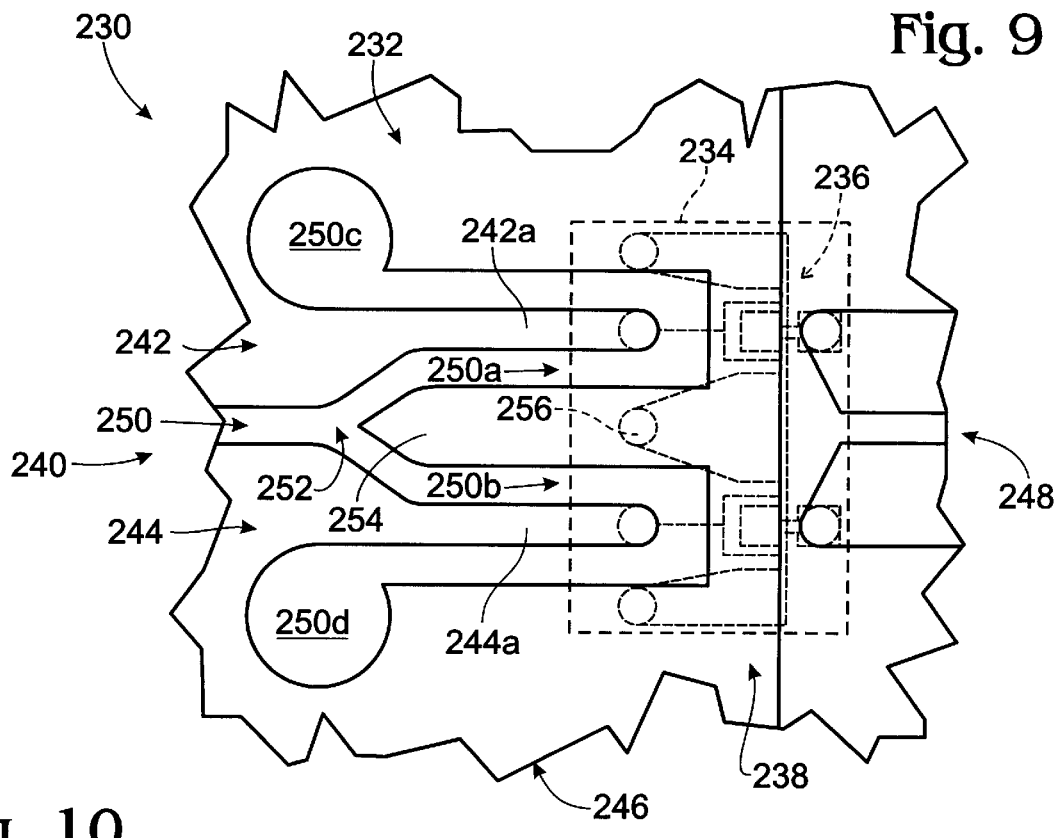
FIG. 9 is a plan view of an embodiment illustrating another feature of the invention similar to the embodiment shown in FIG. 7.

FIG. 9 illustrates a portion of a power amplifier 230 having a motherboard subcircuit 232 to which is flip-mounted a FET chip 234, shown in dashed lines. As was the case with amplifier 200, the FETs, such as FET 236, in an array 238 of FETs in chip 234, are connected electrically in series at the input (gate).

Amplifier 230 provides a conversion from an input slotline 240 formed by coplanar conductors 242 and 244, both of which are part of a planar metalization 246, to a single output slotline 248. These output lines could be combined in a manner similar to the input circuit or as push-pull lines.

Also, instead of terminating in the E-shaped slot of amplifier 200 illustrated in FIG. 7, an input slot 250 divides at a junction 252 into elongate U-shaped slots 250a and 250b. The U-shaped slots terminate in circular openings 250c and 250d. These openings function as open circuits, thereby allowing the input signal to be carried by respective conductors formed as open-ended conductor legs 242a and 244a extending into the U-shaped slots. An intermediate conductor 254, part of metalization 246, extends from junction 252 to source terminals, such as terminal 256, of the FETs. The mounting and connection of the FETs to the conductors is the same as that described with regard to the other amplifiers.

Figure 10:
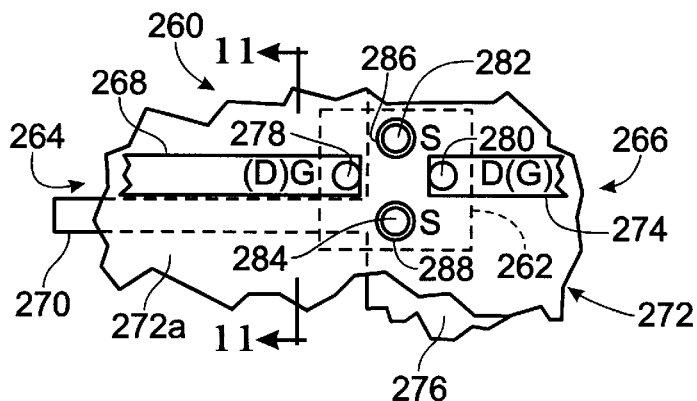
FIG. 10 is a plan view of yet another embodiment in the form of an active conversion between a slot-line and a microstrip line.
Figure 11:
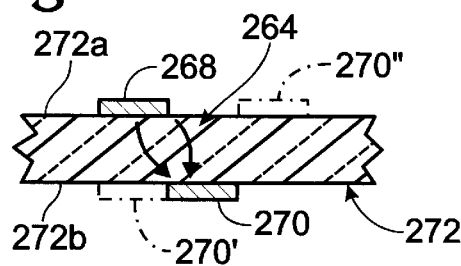
FIG. 11 is a cross section taken along line 11—11 in FIG. 10.

FIGS. 10 and 11 illustrate an amplifier 260 made according to the invention. Amplifier 260 includes a chip 262, shown in a dashed outline, having a single FET, not separately identified, flip mounted onto the proximal ends of a non-coplanar slotline 264 and a microstrip line 266. Amplifier 260 may thus also be used as an active launch between slotline and microstrip. The connection of the FET to the slotline and microstrip line may be reversed.

Slotline 264 includes conductors 268 and 270 separated by an insulating substrate 272 on which they are mounted. Upper conductor 268 is mounted on the upper surface 272a of the substrate, and lower conductor 270 is mounted on the lower surface 272b. As shown in the figures, the conductors are preferably offset so that the near edge of one is in line with (directly opposite) the near edge of the other. This structure causes the slot to be defined by adjacent edges of the conductors, as with a coplanar slotline.

Conductors 268 and 270 could also be positioned directly opposite each other, as represented by conductor 270' shown in outline, or coplanar with conductor 268 as represented by conductor 270". Conductor 268 would be broadside coupled to conductor 270'.

Microstrip line 266 includes a signal conductor 274 mounted on upper surface 272a. Conductor 274 is preferably in line with conductor 268. A ground plane 276 is mounted on lower surface 272b and is connected to conductor 270.

Chip 262 has a gate terminal mounted onto a mounting pad 278 located on the proximal end of conductor 268. A drain terminal is mounted onto pad 280 located on the proximal end of conductor 274. Two source terminals are mounted onto pads 282 and 284, which in turn are connected to ground plane 276 by associated vias 286 and 288 extending through substrate 272.

FIG. 12 illustrates a specific embodiment of the circuit structure of FIG. 1 configured as a mixer 300. Like components are given the same reference numbers as used with reference to FIG. 1 to simplify the description, it being understood that the actual structure will be different for different applications and design criteria.

Conductors 18, 20, 32, 34 and 38 have lengths and widths, and slots 22 and 36 have widths appropriate to provide the desired impedances. A local oscillator (LO) 302 is coupled to the distal end of slotline 12. The input radio frequency (RF), signal is applied to the distal end of slotline 14. Fifth conductor 38 has one distal end 38c spaced from connection region 30, at which the intermediate frequency (IF) signal is taken.

In operation, the LO signal alternatively turns one FET on and the other off, commutating the IF connection to either the positive or negative side of the RF input.

Figure 13:
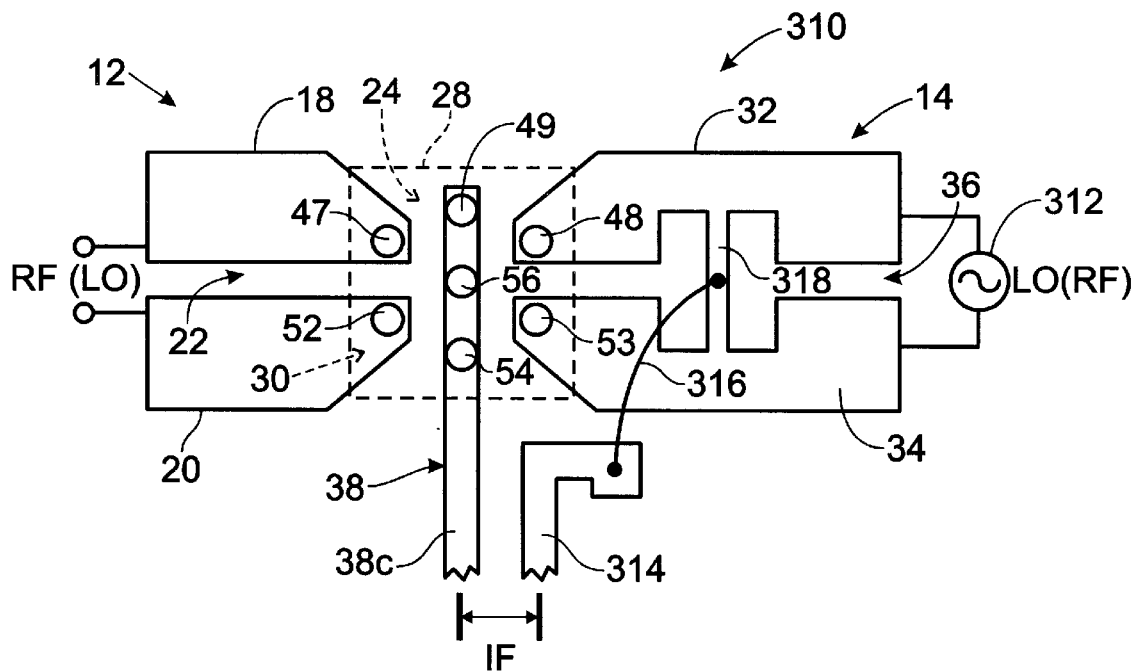
FIG. 13 is a plan view of a second embodiment of a mixer made according to the invention.

It should be noted that mixer 300 and the other mixers illustrated in FIGS. 13 and 15 may be used in a downconverter or an upconverter. Thus, an IF signal may be applied to the IF terminals to produce an RF signal, or an RF signal may be applied to the RF terminals to produce an output IF signal. Also, the local oscillator and RF signal contacts may be reversed in these mixers.

FIG. 13 illustrates a variation of the mixer embodiment of FIG. 12. As in FIG. 12, like components are given the same reference numbers as used with reference to FIG. 1. The mixer 310 of FIG. 13 has a local oscillator (LO) 312 coupled to the distal end of slotline 14. The high frequency RF signal is applied to or transmitted from the distal end of slotline 12. One contact for conducting the intermediate frequency (IF) signal is taken on distal end 38c of conductor 38. A second IF conductor 314 is connected by an air bridge or bond wire 316 to the center of an inductive link conductor 318 extending between conductors 32 and 34. Conductor 318 is preferably less than $\lambda/2$ in length, so that the connection point for air bridge 316 is less than $\lambda/4$ from each of the respective conductors 32, 34. By making the lengths from the conductors to the connection point less than $\lambda/4$, capacitive reactance cancellation is provided for impedance matching.

Figure 14:
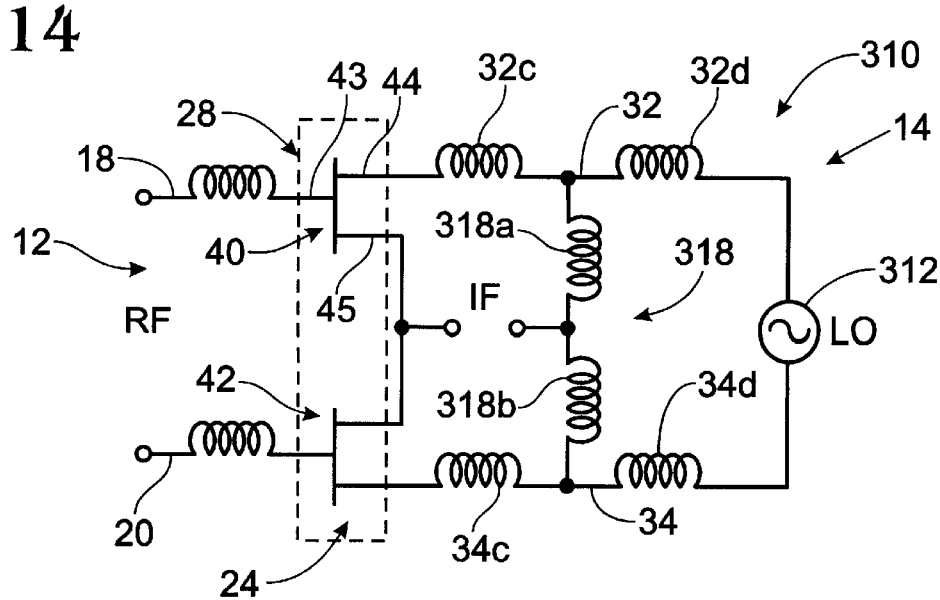
FIG. 14 is a schematic of the mixer of FIG. 13.

A schematic of the mixer of FIG. 13 is shown in FIG. 14. The circuit elements are as labeled for FIG. 1. The RF signal is coupled to the gates of FETs 40 and 42 by slot conductors 18 and 20. Similarly, conductors 32 and 34 forming slotline 14 couple the local oscillator signal to the drains of the FETs. These elements, shown as coupled inductances 32c and 32d for conductor 32 and inductances 34c and 34d for conductor 34, are symbolic of the slot transmission line interconnection. Intermediate the ends of conductors 32 and 34, which is between inductances 32c and 32d, and between inductances 34c and 34d, extends link conductor 318. Air bridge 316 contacts the middle of conductor 318, dividing it into inductances 318a and 318b, as shown. The intermediate frequency signal is received (or transmitted) on terminals connected to the common FET source conductor 38 and the intermediate point of conductor 318. Although at high frequencies, air bridge or wire 316 and conductors 318 and 314 also contribute inductance, these components are not shown in the schematic for simplicity. These values are compensated for in an associated impedance matching circuit, also not shown.

Link conductor 318 is narrow, as shown in FIG. 13, resulting in a high impedance path for the RF signal, thereby serving to filter out the RF signal from the IF conductors. Further, since the local oscillator applies a balanced signal, the contact point on link conductor 318 is a virtual ground, causing the local oscillator signal to be inherently filtered from the IF signal. Mixer 310 thus provides particular advantage for compactness in design without sacrificing functionality.

Finally, FIG. 15 illustrates a mixer 320 that is a further modification of the mixer of FIG. 12. Mixer 320 has a first split slotline 322 for conducting the local oscillator signal composed of primary conductors 324 and 326. Similarly, a second split slotline 328, for conducting the radio frequency signal, is composed of primary conductors 330 and 332. A pair of FET chips 334 and 336 each contain a pair of FETs, as illustrated in FIG. 1. Chips 334 and 336 could be formed as a single chip. These chips define respective connection regions 338 and 340.

A fifth conductor 342 extends continuously through both connection regions for contact with flip-mounted source terminals of the FETs, as has been described. The fifth conductor also has a pointed triangular portion 342a that tapers from a point 342b distal of the connection region to a broad base 342c in the connection region.

Yet a sixth conductor 344, similar to triangular portion 342a of the fifth conductor, is positioned between conductors 330 and 332 and has a triangle shape. The sixth conductor tapers from a point 344a distal of the connection region to a broad base 344b in the connection region. In the connection region, base 344b is adjacent to the fifth conductor and between the proximal ends of conductors 330 and 332, as shown.

The intermediate frequency signal is taken across the grounded ends of the intermediate frequency current return inductors, and point 344a of the sixth conductor, as shown. The V-shaped slot lines formed by the triangular conductors help to balance the LO and RF inputs. The sixth conductor, constructed as shown, is thus at the virtual ground for both the local oscillator and high frequency signals, thereby reducing the need for selective filtering of these components from the IF conductors. Also, the application of the local oscillator to the gates of the FETs, as shown in FIGS. 12 and 15, provides improvement in the output power saturation point but without the advantage of RF signal gain provided by the FETs in the configuration of mixer 310. The operation of mixer 320 is similar to mixer 300 except that two active devices are driven in parallel.

The inductors may be realized using bond wires of appropriate length, and the capacitors may be realized using coupled conductor strips. The RF and LO inputs can be interchanged in this design without changing the functionality of the circuit. This reverse feed arrangement would make the design similar to the mixer shown in FIG. 3. Additionally, the local oscillator is balanced, and therefore provides a virtual ground on the FETs. This isolates the local oscillator from the RF and IF ports without the need for frequency filtering.

The present invention thus provides for flip mounting of a chip circuit on a slotline. The conductors may be broad or strip in form. A single signal path in a slotline may be divided into plural signal paths using slot strip line structure, or conversely several signal paths may be combined into one. Manufacturing of the circuit is facilitated by having both signal conductors on the same surface of a substrate, although intermediate connections between separated ground plane conductors may be maintained through the use of noncoplanar techniques, such as metalization on the opposite side of the substrate. Further, appropriate design of the signal paths provides selected amounts of inductance and capacitance for impedance matching.

Capacitance and inductance are readily accommodated by coplanar design techniques, or may be augmented by other techniques, such as discrete elements or even a flip-chip mounted to the slotline conductors. More generally, impedance matching may be provided by such techniques as substrate patterning, chip attachment, adding dielectric layers on conductors, and backside metalization. Similarly, flip mounting a transistor chip to the end of a slotline provides ease of manufacture, consistent quality and improved performance characteristics. A power amplifier can thus be achieved by using a plurality of small amplifiers connected in parallel and impedance matched individually. Similarly, a push-pull power amplifier could be built according to the invention by using multiple push-pull slotlines.

It will be apparent to one skilled in the art that variations in form and detail may be made in the preferred embodiments without varying from the spirit and scope of the invention as defined in the claims and any modification of the claim language or meaning as provided under the doctrine of equivalents. For instance, the embodiments described provide different configurations for flip mounting a chip on a slotline, and for splitting the signal path of a slotline and achieving impedance matching through coplanar components. The preferred embodiments are thus provided for purposes of explanation and illustration, but not limitation.

The invention claimed is:

1. A slot-line-based circuit structure comprising:
   an electrically insulating substrate having a planar face and a connection region;
   a first slotline mounted relative to said substrate face and consisting of first and second, spaced-apart conductors extending into said connection region, and defining there between a first slot;
   a second slotline mounted relative to said substrate spaced from said first slotline, said second slotline consisting of third and fourth, spaced-apart conductors also extending into said connection region, and defining there between a second slot;
   a fifth conductor extending into said connection region and spaced from said first, second, third and fourth conductors; and
   a chip circuit flip mounted onto said connection region of said substrate for conducting an electrical signal relative to said first and second slotlines, said chip circuit comprising a pair of transistors having two control terminals and three current-carrying terminals, said control terminals being connected to said first and second conductors, and said current-carrying terminals being connected to said third, fourth and fifth conductors.

2. A circuit structure according to claim 1 wherein said fifth conductor includes a portion extending into one of said first and second slots for capacitively coupling said fifth conductor to the conductors forming said one slot.

3. A slot-line-based circuit structure comprising:

an electrically insulating substrate having a first planar face and a first connection region;

a slotline mounted relative to said substrate face and consisting of first and second, spaced-apart conductors extending into said connection region, and defining there between a slot;

a third conductor extending into said connection region and spaced from said first and second conductors, said third conductor including a portion extending into said slot for capacitively coupling said third conductor to said first and second conductors; and a chip circuit flip mounted onto said connection region of said substrate for conducting an electrical signal relative to said slotline, with a first terminal flip mounted onto said first conductor and a second terminal coupled to said second conductor.

4. A slot-line-based circuit structure comprising:

an electrically insulating substrate having a first planar face and a first connection region;

a slotline mounted relative to said substrate face and consisting of first and second, spaced-apart conductors extending into said connection region, and defining there between a slot, said slot having a junction distally of said connection region and dividing into first and second slot portions with said first and second conductors defining a first slotline portion;

a third conductor coplanar with said first and second conductors, disposed adjacent to and spaced from said first conductor distally of said junction for defining a distal slotline portion, and disposed adjacent to and spaced from said second conductor along said second slot portion for defining a second slotline portion; and a first chip circuit flip mounted onto said connection region of said substrate for conducting an electrical signal relative to said slotline, with a first terminal flip mounted onto said first conductor and a second terminal coupled to said second conductor.

5. A circuit structure according to claim 4 wherein said substrate has a second connection region and said second slot portion extends into said second connection region, said circuit structure further comprising a second chip circuit flip mounted on said second connection region with a first terminal flip mounted to said second conductor and a second terminal flip mounted to said third conductor, said second slotline portion conducting an electrical signal relative to said second chip circuit.

6. A circuit structure according to claim 5 wherein said first and second chip circuits are formed as a single chip.

7. A slot-line-based circuit structure comprising:

an electrically insulating substrate having a planar face and a connection region;

a slotline mounted relative to said substrate face and consisting of first and second, spaced-apart conductors extending into said connection region, and defining there between a first slot, said slotline being U-shaped, having a first portion extending adjacent to a second portion, said first portion providing electromagnetic coupling to a signal transmitted along said second portion, said U-shaped slotline further including a base portion coupling said first and second portions, and defining a peninsula conductor extending into said U-shaped slotline;

a chip circuit flip mounted onto said connection region of said substrate for conducting an electrical signal relative to said slotline, with a first terminal flip mounted onto said first conductor and a second terminal coupled to said second conductor.

8. A circuit structure according to claim 7 wherein said chip circuit comprises a transistor having a control terminal and two current-carrying terminals, said chip circuit being mounted relative to said substrate with said control terminal flip-mounted onto said peninsula conductor.

9. A circuit structure according to claim 7 wherein said first portion of the U-shaped slotline terminates in an enlarged opening.

10. A circuit structure according to claim 9 wherein said opening is generally circular.

11. A circuit structure according to claim 10 wherein said first portion has a generally uniform width and said opening has a radius greater than said uniform width.

12. A circuit structure according to claim 11 wherein said opening has a circumferential edge and said first portion has an edge that intersects tangentially with said circumferential edge.

13. A slot-line-based circuit structure comprising:

an electrically insulating substrate having a planar face with a connection region;

a first slotline mounted on said substrate face and consisting of first and second, spaced-apart coplanar conductors having proximal ends extending into said connection region, and defining therebetween a first slot;

a second slotline mounted on said substrate face spaced from said first slotline and consisting of third and fourth spaced-apart coplanar conductors having proximal ends extending into said connection region, and defining therebetween a second slot, the proximal ends of said first and second conductors being spaced from the proximal ends of said third and fourth conductors;

a fifth conductor, also mounted on said substrate face, and spaced from and coplanar with said first, second third and fourth conductors and having a proximal portion positioned in said connection region, said proximal portion also being spaced from said proximal ends of said first and second slotlines; and a chip circuit comprising first and second transistors flip mounted in said connection region to said first, second, third, fourth and fifth conductors for receiving a signal input on said first slotline and for outputting a signal amplified by said transistors on said second slotline.

14. A circuit structure according to claim 13 wherein said fifth conductor is connected to a common reference potential.

15. A circuit structure according to claim 13 wherein said transistors each include a control terminal and two current-carrying terminals, with each control terminal being connected to a respective one of said first and second conductors, one current-carrying terminal of each transistor being connected to a respective one of said third and fourth conductors, and said other of said current-carrying terminals of each of said transistors being connected to said fifth conductor.

16. A circuit structure according to claim 15 wherein the transistors are field-effect transistors, said control terminals are gate terminals, and said current-carrying terminals are respectively sources and drains, said drains being connected to said third and fourth conductors.

17. A circuit structure according to claim 15 comprising a mixer, said first and second slotlines having respective distal ends, and said fifth conductor having a distal portion extending from said connection region, said circuit structure further comprising a local oscillator coupled to said distal end of one of said first and second slotlines, said mixer for converting between a high frequency signal transmitted on the distal end of the other of said slotlines and an intermediate-frequency signal transmitted on the distal portion of said fifth conductor.

18. A circuit structure according to claim 17 further comprising a sixth conductor connecting said conductors forming said other slotline intermediate the ends of said conductors forming said other slotline.

19. A circuit structure according to claim 18 wherein the distal end of said sixth conductor forms a terminal for conducting said intermediate frequency signal.

20. A circuit structure according to claim 18 further wherein said sixth conductor has high impedance relative to said conductors forming said other slotline.

21. A circuit structure according to claim 17 wherein said fifth conductor extends continuously between the proximal ends of said first and second slotlines.

22. A circuit structure according to claim 15 comprising a first oscillator, said first slotline forming a resonator, said second slotline having a distal end, said fifth conductor being coupled to a reference potential, and said distal end of said second slotline being the output of said oscillator.

23. A circuit structure according to claim 22 comprising a dual oscillator, said circuit structure further comprising a second oscillator having the same structure as the first oscillator, with said second conductor of said first oscillator integrally joined with the first conductor of said second oscillator.

24. A circuit structure according to claim 23 wherein said fifth conductor of said first oscillator is connected to the fifth conductor of said second oscillator.

25. A circuit structure according to claim 24 wherein each of said fifth conductors includes a portion extending into each second slot for capacitively coupling said fifth conductors to the adjacent third and fourth conductors.

26. A circuit structure according to claim 23 wherein said transistors for said first and second oscillators are formed as a single chip.

27. A circuit structure according to claim 22 wherein said fifth conductor includes a portion extending into said second slot for capacitively coupling said fifth conductor to said third and fourth conductors.

28. A circuit structure according to claim 13 wherein said fifth conductor includes a portion extending into said second slot for capacitively coupling said fifth conductor to said third and fourth conductors.

29. A circuit structure according to claim 28 wherein said transistors are field-effect transistors with a gate connected to each of said first and second conductors, a drain connected to each of said third and fourth conductors, and the sources connected to said fifth conductor.

30. A circuit structure according to claim 13 further comprising a capacitor coupling said fifth conductor to at least one of said first and second slotlines.

31. A circuit structure according to claim 30 wherein said capacitor comprises a portion of said fifth conductor extending between the conductors of said one slotline.

* * * * *